US010215554B2

United States Patent
Kim et al.

(10) Patent No.: US 10,215,554 B2
(45) Date of Patent: Feb. 26, 2019

(54) APPARATUS AND METHOD FOR NON-CONTACT SAMPLE ANALYZING USING TERAHERTZ WAVE

(71) Applicant: INDUSTRY-UNIVERSITY COOPERATION FOUNDATION HANYANG UNIVERSITY, Seoul (KR)

(72) Inventors: Hak-Sung Kim, Seoul (KR); Wan-Ho Chung, Paju-si (KR); Sung-Hyeon Park, Gimhae-si (KR); Dong-Hyun Kim, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 308 days.

(21) Appl. No.: 15/130,545

(22) Filed: Apr. 15, 2016

(65) Prior Publication Data

US 2016/0305995 A1    Oct. 20, 2016

(30) Foreign Application Priority Data

Apr. 17, 2015  (KR) .................. 10-2015-0054549
Apr. 12, 2016  (KR) .................. 10-2016-0045037

(51) Int. Cl.
G01B 11/06    (2006.01)
G01R 27/02    (2006.01)
G01R 31/309   (2006.01)

(52) U.S. Cl.
CPC ............ *G01B 11/06* (2013.01); *G01R 31/309* (2013.01)

(58) Field of Classification Search
CPC .............................. G01B 11/06; G01R 31/309
(Continued)

(56) References Cited

U.S. PATENT DOCUMENTS 5,866,896 A * 2/1999 Georgiades ........... G02F 1/3526
                                                  250/201.1
7,446,601 B2 * 11/2008 LeChevalier ............ H01J 3/36
                                                    315/364
(Continued)

FOREIGN PATENT DOCUMENTS

JP    2013-195281 A     9/2013
KR    1020140054165 A   5/2014

*Primary Examiner* — Long K Tran
(74) *Attorney, Agent, or Firm* — Ladas & Parry LLP

(57) ABSTRACT

Disclosed are an apparatus and a method for non-contact sample analysis using terahertz waves. The apparatus includes an emission unit radiating terahertz waves onto a sample provided with a conductive material layer, and a receiving unit receiving terahertz waves reflected from the sample or terahertz waves passing through the sample. The apparatus further includes a characteristic analysis unit including at least one selected from a group consisting of a sheet resistance analysis unit analyzing a sheet resistance of the conductive material layer, a coverage density analysis unit analyzing a coverage density of the conductive material layer, a component analysis unit analyzing a component of the conductive material layer, and a thickness analysis unit analyzing a thickness of the conductive material layer by using the received terahertz waves, a display unit displaying a result derived from the characteristic analysis unit as an image, and an input unit configured to input information to the characteristic analysis unit.

17 Claims, 7 Drawing Sheets

(58) Field of Classification Search
USPC .......................................................... 702/65
See application file for complete search history.

(56) References Cited

U.S. PATENT DOCUMENTS

| | | | | |
|---|---|---|---|---|
| 7,977,116 B2* | 7/2011 | Kasai | ................. | G01N 21/3577 |
| | | | | 356/301 |
| 8,064,142 B2* | 11/2011 | Batchko | ................... | G02B 3/14 |
| | | | | 359/665 |
| 9,097,684 B2* | 8/2015 | Tomioka | ............ | G01N 21/3581 |
| 9,464,042 B2* | 10/2016 | Kim | ....................... | C07C 279/26 |
| 9,638,582 B2* | 5/2017 | Tomioka | ................... | G01J 3/42 |
| 2014/0252231 A1* | 9/2014 | Tomioka | ............ | G01N 21/3581 |
| | | | | 250/338.1 |
| 2014/0264029 A1* | 9/2014 | Tomioka | ................... | G01J 3/42 |
| | | | | 250/338.3 |

* cited by examiner

APPARATUS AND METHOD FOR NON-CONTACT SAMPLE ANALYZING USING TERAHERTZ WAVE

CLAIM FOR PRIORITY

This application claims priority to Korean Patent Application Nos. 2015-0054549 and 2016-0045037 filed on Apr. 17, 2015 and Apr. 12, 2016, respectively, in the Korean Intellectual Property Office (KIPO), the entire content of which is hereby incorporated by reference.

BACKGROUND

1. Technical Field

Example embodiments of the present invention relate in general to the field of an apparatus for non-contact sample analysis, and more particularly, to an apparatus for non-contact sample analysis using terahertz waves.

2. Related Art

Recently, with increasing interest and demand for flexible products in displays of a mobile phone, a television, a touch panel, a solar cell and an electronic newspaper, a high performance electronic device product is needed. The high performance electronic device needs to have electrical resistance at a predetermined level or less while maintaining uniformity of resistance, and thus the device has to be subjected to a resistance measurement.

Currently, as a typical example of a method for measuring electrical resistance of electronic devices, a sheet resistance measurement method using a four-point probe is used in which four probes come in contact with a sample to measure its own sheet resistance, a first probe and a fourth probe are supplied with a constant voltage and a current flowing between a second probe and a third probe is measured, or the second probe and the third probe are supplied with a constant current and a voltage between the first probe and the fourth probe is measured, so that resistance can be calculated through Ohm's law. However, the four-point probe measurement method has a constraint in which a sample is damaged by the four probes in contact with the sample. In particular, when a measurement area to perform a resistance measurement on a large-scale sample is increased, a damaged area of the sample is also increased, and thus the measurement accuracy gradually is lowered due to the damaged area. In addition, since a sheet resistance measured at an edge of a sample shows a great deviation, the above method has difficulty in measuring a resistance of a large-scale sample.

To overcome the constraints with contact-type resistance measurement, methods and apparatuses for non-contact type resistance measurement using an electric field generated from electromagnetic waves have been suggested. For example, Korean Unexamined Patent Application Publication No. 10-2004-0106107 discloses a non-contact sheet resistance measuring instrument, and in particular, relates to a sheet resistance measuring instrument for measuring a resistance component of a sheet, such as a semiconductor wafer or lens, in which an object to be measured is located parallel to a direction of an electric field of electromagnetic waves generated by an electromagnetic wave transmitter, and an electromagnetic wave receiver detects electric field absorption of the object to be measured so that a resistance value can be measured in a non-contact manner.

In addition, Japanese Unexamined Patent Application Publication No. 2003-227855 discloses a method and an apparatus for measuring a sheet resistance, and in particular, relates to a method of measuring a sheet resistance of one of a metal, a super conductor, and a semiconductor, in which an object to be measured is mounted on a substrate holder to be parallel to a control conductor having a sheet resistance, a dielectric load is fixed while spaced a predetermined distance from the object to be measured, and high-frequency electromagnetic waves are applied to the dielectric load to generate an electromagnetic field to resonate the conductor and the object to be measured so that a sheet resistance of the object to be measured can be measured from the resonance.

However, the above-described apparatus and method for sheet resistance measurement using an electric field has a low measurement accuracy compared to the contact-type apparatus and method, and has difficulty in recognizing a position of a transparent electrode and an electronic device in which damage has occurred. Accordingly, there is difficulty conducting a performance evaluation of a sheet resistance measurement together with a reliability evaluation of a resistance uniformity measurement.

Meanwhile, terahertz waves refer to electromagnetic waves ranging between microwaves and optical waves that have both a transmission property of electric waves and an absorptiveness property of light so that terahertz waves can pass through various types of materials (plastic, ceramic, paper, rubber and clothes), and are entirely reflected by a metal. Accordingly, terahertz waves, when radiated onto an electronic device, pass through a substrate formed of a highly polymerized compound that supports an electrode and are reflected from an electrode formed of a metal. Accordingly, at a damaged portion of the electrode on the substrate, intensity of the reflected waves is reduced or intensity of transmitted terahertz waves is increased. Accordingly, there is a need to develop an apparatus and a method for effectively measuring sheet resistance of an electronic device in a non-contact manner by using the unique characteristics of terahertz waves.

SUMMARY

Accordingly, example embodiments of the present invention are provided to substantially obviate one or more problems due to limitations and disadvantages of the related art.

Example embodiments of the present invention provide an apparatus and a method for non-contact sample analysis using terahertz waves.

The technical objectives of the inventive concept are not limited to the above invention, and other objectives may become apparent to those of ordinary skill in the art based on the following descriptions.

In some example embodiments, an apparatus for non-contact sample analysis using terahertz waves includes: an emission unit configured to radiate terahertz waves onto a sample provided with a conductive material layer, and a receiving unit configured to receive terahertz waves reflected from the sample or terahertz waves passing through the sample. In addition, the apparatus further includes: a characteristic analysis unit including at least one selected from a group consisting of a sheet resistance analysis unit configured to analyze a sheet resistance of the conductive material layer, a coverage density analysis unit configured to analyze a coverage density of the conductive material layer, a component analysis unit configured to analyze a component of the conductive material layer, and a thickness analysis unit configured to analyze a thickness of the conductive material layer by using the received terahertz waves; a display unit configured to display a result derived from the characteristic analysis unit as an image; and an input unit configured to input information to the characteristic analysis unit.

The sheet resistance analysis unit may derive the sheet resistance of the conductive material using Equation 1:

$$\log_{10} R_{sh} = aX + b, \quad \text{[Equation 1]}$$

in Equation 1, X is a reflection ratio or a transmission ratio obtained by using the received terahertz waves, a and b are values depending on a material forming the conductive material layer, and Rsh is the sheet resistance of the conductive material layer.

The characteristic analysis unit may further include a database, and the values a and b shown in Equation 1 are reference values stored in the database to correspond to the material forming the conductive material layer, the sheet resistance analysis unit may be configured to derive the sheet resistance by: deriving a reference value a and a reference value b of Equation 1 from the database on the basis of information about the material forming the conductive material layer that is input from the input unit, and inputting the reflection ratio or transmission ratio obtained by using the received terahertz waves, the reference value a, and the reference value b into Equation 1.

The sheet resistance may represent a sheet resistance of each grid-shaped virtual region on a surface of the conductive material layer, and the display unit may display sheet resistances derived from the sheet resistance analysis unit as two dimensional images with different brightness levels depending on a magnitude of the sheet resistance of each of the regions.

The component analysis unit may derive a type or a mixing ratio of a material that forms the conductive material layer using Equation 1. In detail, the component analysis unit may be configured to derive the type or the mixing ratio of the material forming the conductive material layer: by receiving sheet resistances of two regions of the conducive material having different thicknesses from each other, receiving reflection ratios or transmission ratios obtained using terahertz waves received from the two regions, calculating a linear extrapolation function as shown in Equation 1 based on the reflection ratios or transmission ratios and the sheet resistances of the two regions to calculate a value of a and a value b of Equation 1, and comparing the calculated values a and b with the reference values a and b stored in the database.

The coverage density analysis unit may derive the coverage density using Equations 2 and 3:

$$R = \frac{1}{2}(R_s + R_p) \quad \text{[Equation 2]}$$

$$R_s = \left| \frac{n\cos\theta - n_a\sqrt{1 - \left(\sin\theta \frac{n}{n_a}\right)^2}}{n\cos\theta + n_a\sqrt{1 - \left(\sin\theta \frac{n}{n_a}\right)^2}} \right|^2$$

$$R_p = \left| \frac{n\sqrt{1 - \left(\sin\theta \frac{n}{n_a}\right)^2} - n_a\cos\theta}{n\sqrt{1 - \left(\sin\theta \frac{n}{n_a}\right)^2} + n_a\cos\theta} \right|^2,$$

in Equation 2, R is a reflection ratio obtained by using the received terahertz waves, n is a refractive index of the conductive material layer, θ is an incident angle of the terahertz waves with respect to the sample, and $n_a$ is a refractive index of a medium over the sample, $$\frac{n^2 - 1}{4\pi + b(n^2 - 1)} = D_c \frac{N_A \alpha}{M} \rho_m, \quad \text{[Equation 3]}$$

in Equation 3, Dc is the coverage density, n is the refractive index of the conductive material layer, b is a dimensionless constant value for a local electric field, $N_A$ is Avogadro's number, α is molar polarizability, M is a molecular weight, and $\rho_m$ is a density, wherein the dimensionless constant value for the local electric field b, the molar polarizability α, the molecular weight M, and the density $\rho_m$ are values based on the material forming the conductive material layer.

The database may further include information about the incident angle θ of the terahertz waves with respect to the sample, the refractive index $n_a$ of the medium of the upper portion of the sample, the dimensionless constant value for the local electric field b, the molar polarizability α, the molecular weight M, and the density $\rho_m$.

The coverage density may represent a coverage density of each grid-shaped virtual region on a surface of the conductive material layer, and the display unit may display coverage densities derived from the coverage density analysis unit as two dimensional images with different brightness levels depending on a magnitude of the coverage density for each of the regions.

The thickness analysis unit may derive the thickness of the conductive material layer by using Equation 4:

$$T = \frac{1}{2} v \Delta t \cos\theta, \quad \text{[Equation 4]}$$

in Equation 4, T is the thickness of the conductive material layer, v is a velocity of the terahertz waves, Δt is a difference between a time at which terahertz waves reflected from an upper surface of the conductive material layer and received by the thickness analysis unit has a maximum intensity and a time at which terahertz waves reflected from a lower surface of the conductive material layer and received by the thickness analysis unit has a maximum intensity, and θ is an incident angle of the terahertz waves with respect to the sample.

In other example embodiments, a method for non-contact sample analysis using terahertz waves includes radiating terahertz waves onto a sample provided with a conductive material layer; receiving terahertz waves reflected from the sample or terahertz waves passing through the sample; and performing at least one analysis of an analysis of a sheet resistance of the conductive material layer, an analysis of a coverage density of the conductive material layer, an analysis of a component of the conductive material layer, and an analysis of a thickness of the conductive material layer by using the received terahertz waves.

BRIEF DESCRIPTION OF DRAWINGS

Example embodiments of the present invention will become more apparent by describing example embodiments of the present invention in detail with reference to the accompanying drawings, in which.

DESCRIPTION OF EXAMPLE EMBODIMENTS

Hereinafter, the present invention will be explained in detail with reference to accompanying drawings. However, the scope of the present invention is not limited to such embodiments and the present invention may be realized in various forms.

In the following description, when an element (or layer) is referred to as being "on" another element (or layer), the element (or the layer) can be directly on another element (or layer) or intervening layers may also be present therebetween. In addition, when an element is referred to as being "directly on" another element, intervening layers may not be present therebetween.

Figure 1:
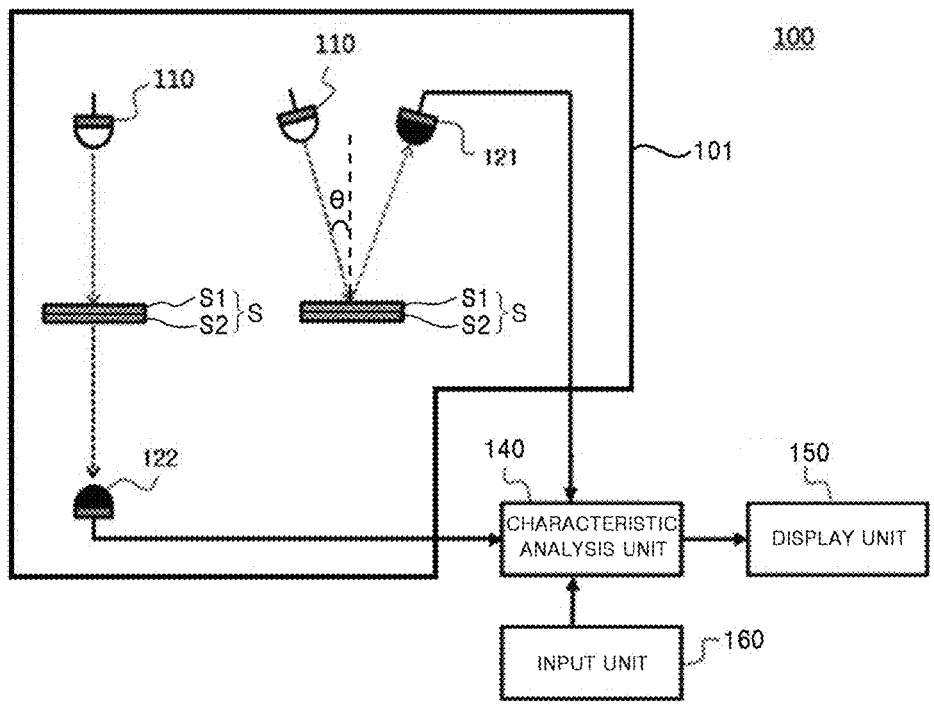
FIG. 1 is a schematic diagram illustrating an apparatus for non-contact sample analysis according to an example embodiment of the present invention.

FIG. 1 is a schematic diagram illustrating an apparatus for non-contact type sample analysis according to an example embodiment of the present invention.

Referring to FIG. 1, an apparatus for non-contact sample analysis 100 includes at least one emission unit 110 configured to radiate terahertz waves onto samples S and receiving units 121 and 122 respectively configured to receive terahertz waves reflected from the samples S and terahertz waves passing through the samples S. The sample S may be located on a stage (not shown). The emission unit 110, the receiving units 121 and 122, and the stage may be located in a chamber 101.

In addition, the apparatus for non-contact sample analysis 100 may further include a characteristic analysis unit 140 configured to analyze characteristics of the sample using the received terahertz waves, specifically, it is configured to extract required data from the received terahertz waves, and analyze characteristics of the sample using the data. A result derived from the characteristic analysis unit 140 may be provided to a user through a display unit 150, and an input unit 160 may be connected to the characteristic analysis unit 140 such that the user may input certain information through the input unit 160.

The terahertz waves are electromagnetic waves in a wavelength range of 30 μm to 3 mm and a frequency range of 0.1 to 10 THz, and having a great penetration power due to a wavelength longer than visible rays or infrared rays and able to be measured even at a place having external light due to a superior linearity. Accordingly, an analysis apparatus using terahertz waves does not require an additional apparatus for blocking external light. A terahertz radiation source may be implemented in a pulse type or a continuous signaling type, and may be provided as one or multiple sources. When a plurality of terahertz radiation sources are provided, the two-dimensional test about sample S may easily and quickly be conducted.

The receiving units 121 and 122 may convert the terahertz waves reflected from or passing through the samples S into electric signals, and deliver the converted electric signals to the characteristic analysis unit 140. In addition, the receiving units are classified as a reflected wave receiving unit 121 which receives the terahertz waves reflected from a sample and a transmitted wave receiving unit 122 which receives the terahertz waves passing through a sample. However, the present invention is not limited thereto, and one of the receiving units may be changed in position to be used as a reflective wave receiving unit or a transmitted wave receiving unit. In addition, according to a reflected wave measurement mode and a transmitted wave measurement mode, not only the position of the receiving unit but also positions of the emission unit 110 and the sample S may be adjusted. For example, in the reflected wave measurement mode, the emission unit 110 and the reflected wave receiving unit 121 may be located at both sides of a normal vector on a surface of the sample S at predetermined angles with respect to the normal vector. In this case, an angle θ of terahertz waves emitted from the emission unit 110 with respect to the normal vector may be defined as an incident angle of terahertz waves with respect to the sample S, that is, an incident angle of terahertz waves. In addition, in the transmitted wave measurement mode, the emission unit 110 may be located above an upper surface of the sample S, and the transmitted wave receiving unit 122 may be located below a lower surface of the sample S with the emission unit 110 and the transmitted wave receiving unit 122 located at 90° with respect to the surface of the sample S.

The stage (not shown) which supports the sample S may be movable in X-axis and Y-axis directions, specifically, the stage may move by a predetermined distance in each of the X-axis or the Y-axis direction so that grid-shaped virtual regions on the surface of the sample are all radiated with terahertz waves. Meanwhile, the stage may be formed of a material allowing terahertz waves to pass therethrough. However, when the sample S is significantly small compared to a region to be radiated with terahertz waves, the stage may not move. In addition, the stage may be provided in various methods such as a conveyor type, a roll type and so on to transport the sample S.

In addition, the sample S may include a substrate S2 and a conductive material layer S1 deposited on the substrate S2, and the substrate S2 may be a semiconductor wafer, a glass substrate or a polymer substrate. The sample S may be an electronic device which is being manufactured, for example, a semiconductor wafer having an electrode, a glass substrate having an electrode, or a polymer substrate having an electrode. Depending on situations, the sample S may only include a conductive material layer S1 without the substrate S2.

The conductive material layer S1 may be a metal nanowire layer, a metal mesh layer or a transparent conductive metal oxide layer. The metal nanowire may be a metal nanowire including any one selected from the group consisting of silver, copper, nickel and a composite material of two or more thereof. The transparent conductive metal oxide may be indium tin oxide (ITO) or fluorine-doped tin oxide (FTO). In particular, the metal nanowire layer may implement a transparent conductive layer at a lower price compared to ITO layer including indium, and even when bent, provide a superior electrical conductive, and thus the metal nanowire layer may be applied as a material of a transparent electrode of a flexible device. However, due to a configuration of the metal nanowire layer having metal nanowires randomly deposited while overlapping each other, it is known that it is difficult to determine a defect in the metal nanowire according to a general measurement method.

Figure 2:
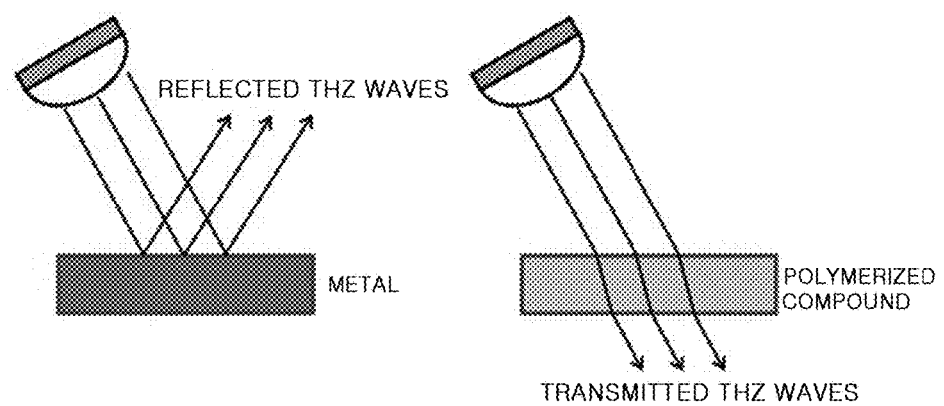
FIG. 2 is a conceptual diagram illustrating terahertz waves that are reflected or transmitted depending on a material of a surface of a sample.

First, terahertz waves radiated from the emission unit 110 may pass through the sample S, specifically, through the conductive material layer S1, or may be reflected from the sample S, specifically, from the conductive material layer S1. The passing of the terahertz waves through the sample S or the reflection of terahertz waves from the sample S may vary depending on a material of the sample S. In detail, as a metal content in the sample S increases, the radiated terahertz waves may be easily reflected, and the intensity of the reflected terahertz waves, that is, the intensity of the terahertz waves received by the reflected wave receiving unit 121 may increase. Meanwhile, as a polymerized compound content in the sample S may increase, the radiated terahertz waves may easily pass through the sample S, and the intensity of the transmitted terahertz waves, that is, the intensity of the terahertz waves received by the transmitted wave receiving unit 122 may increase (see FIG. 2).

Figure 3:
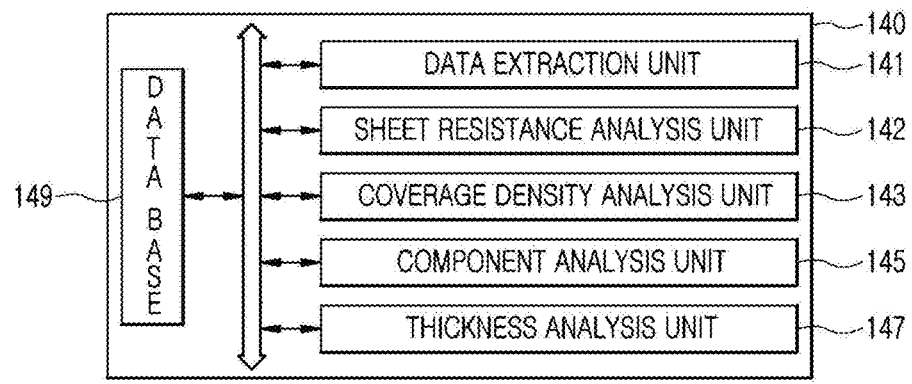
FIG. 3 is a block diagram illustrating a characteristic analysis unit shown in FIG. 1.
Figure 4:
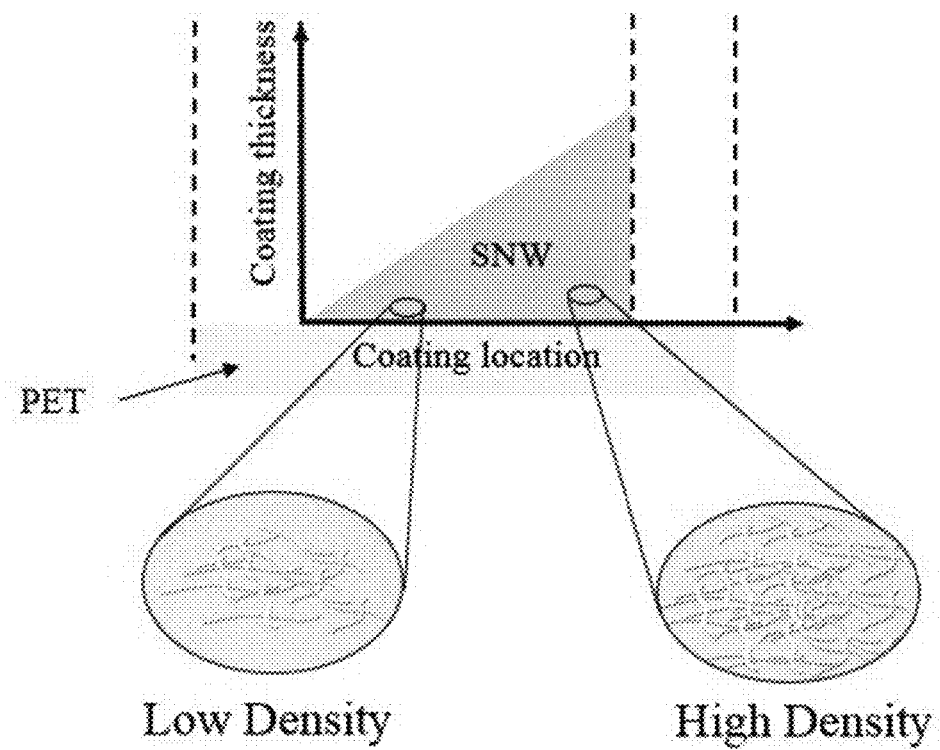
FIG. 4 is a mimetic diagram illustrating a cross section of a sample having a thickness gradient according to sample preparation example 1.

FIG. 3 is a block diagram illustrating a characteristic analysis unit shown in FIG. 1.

Referring to FIGS. 1 and 3, the characteristic analysis unit 140 may include at least one analysis unit selected from a group consisting of a sheet resistance analysis unit 142, a coverage density analysis unit 143, a component analysis unit 145, and a thickness analysis unit 147. In addition, the characteristic analysis unit 140 may further include a data extraction unit 141 and/or a database 149.

The data extraction unit 141 may be a part which analyzes primary data from a change in the intensity of transmitted terahertz waves or reflected terahertz waves received by the receiving units 122 and 122 over time. The main data may be a maximum intensity of the transmitted terahertz waves or the reflected terahertz waves. In addition, the primary data may be a reflection ratio or a transmission ratio. An analyzing of a reflection ratio or a transmission ratio may include deriving an inherent maximum intensity of terahertz waves emitted from the emission unit 110 from the database 149 based on information about the emitter unit 110 that is input from the input unit 160, and calculating a ratio of the maximum intensity of the transmitted terahertz waves or the reflected terahertz waves to the inherent maximum intensity of the terahertz waves. In addition, when a plurality of maximum intensities of transmitted terahertz waves or reflected terahertz waves are detected over time, the primary data may represent X-axis values corresponding to the maximum values, that is, time-dependent values.

Specifically, in the primary data, the maximum intensity of the transmitted terahertz waves or the reflected terahertz waves may be a maximum intensity value in one of a plurality of grid-shaped virtual regions on a surface of the sample, and when terahertz waves are emitted to the plurality of grid-shaped virtual regions, the data extraction unit 141 may derive maximum intensity values of the respective regions, and the display unit 150 may display an image of conductive material layer using the maximum intensities derived from the data extraction unit 141 with different brightness levels depending on a magnitude of the maximum intensity for each region (for example, a region having a greater maximum intensity is displayed at a higher brightness level). Accordingly, a status of the surface for the sample, for example, a defect, may be inspected with the naked eye using the image. In detail, a region having a smaller maximum intensity value than other regions is displayed as a region having a lower brightness level on the image, and such a region displayed at a lower brightness level may be a region having an actual defect.

The sheet resistance analysis unit 142 may be a part configured to analyze a sheet resistance of the sample S, specifically, the conductive material layer S1. The sheet resistance analysis unit 142 may derive the sheet resistance by receiving a reflection ratio or a transmission ratio from the data extraction unit 141, deriving a reference value a and a reference value b of Equation 1 shown below from the database 149 based on information about a material forming the conductive material layer S1 that is input from the input unit 160, and inputting the reflection ratio or the transmission ratio, the reference value a, and the reference value b into Equation 1. The information about the material forming the conductive material layer S1 may be the type of the material forming the conductive material layer S1, or a mixing ratio of a plurality of materials when the conductive material layer S1 includes the plurality of materials. When the conductive material layer S1 is a layer including different types of nanowires mixed with each other, the mixing ratio is a mixing ratio of the different types of nanowires.

$$\log_{10} R_{sh} = aX + b, \qquad \text{[Equation 1]}$$

in Equation 1, Rsh is a sheet resistance of the sample, X is a reflection ratio or a transmission ratio, and a and b are values depending on a material forming the conductive material layer.

Meanwhile, building a database with respect to the reference value a and the reference value b in the database 149 includes: obtaining sheet resistance data of each region of a test sample (that is, a conductive material layer) which includes regions with thicknesses different from each other, whose constituent material's type is identified, and whose constituent materials' mixing ratio is identified when the test sample includes a plurality of constituent materials, for example, using a four-point probe method; obtaining a reflection ratio data or a transmission ratio data of terahertz waves reflected from or transmitted through each region of the test sample; obtaining a linear extrapolation function having the transmission ratio or the reflection ratio as an X-axis while having a common logarithmic value of the sheet resistance as a Y axis; obtaining a gradient of a linear extrapolation function, that is, a gradient of Equation 1 (the reference value a) and a Y-intercept (the reference value b); and storing the obtained reference value a and reference value b which correspond to the constituent material information (the type or the mixing ratio).

Meanwhile, the sheet resistance may represent a sheet resistance of one of the grid-shaped virtual regions on the surface of the sample, and when the plurality of regions are radiated with terahertz waves, the sheet resistance analysis unit 142 may derive the sheet resistance of each of the grid-shaped regions using the above-described method, and the display unit 150 may display the derived sheet resistances derived from the sheet resistance analysis unit 142 as two dimensional images with different brightness levels depending on a magnitude of the sheet resistance of each region (for example, a region having a greater sheet resistance is displayed at a lower brightness). Accordingly, a status of the surface of the sample, for example, a defect, may be inspected with the naked eye using the image. In detail, a region having a greater maximum value than other regions is displayed at a lower brightness, and such a region displayed at a lower brightness may be a region having an actual defect.

The component analysis unit 145 may be a part configured to analyze a type or a mixing ratio of the sample S, specifically, the conductive material layer S1. When the conductive material layer S1 is a layer including different types of nanowires mixed with each other, the mixing ratio is a mixing ratio of the different types of nanowires. The component analysis unit 145 may receive sheet resistances of two regions of the conductive material layer S1 having thicknesses different from each other from the input unit 160, receive reflection ratios or transmission ratios of terahertz waves radiated onto each of the two regions from the data extraction unit 141, calculate a linear extrapolation function based on the reflection ratios or transmission ratios and the sheet resistance data of the two regions to calculate values a and b of Equation 1, compare the calculated values a and b with the reference values a and b stored in the database 149 to derive a reference value a and a reference value b that are closest to the calculated values a and b stored in the database 149, and derive a type or a mixing ratio of the conductive material layer S1 corresponding to the derived reference values a and b.

The coverage density analysis unit 143 may be a part configured to analyze an area ratio of the sample S coated with the conductive material layer S1 on the substrate S2. The coverage density analysis unit 143 may derive a coverage density by receiving a reflection ratio from the data extraction unit 141, inputting the reflection ratio into Equation 2 (Fresnel's equation) below to calculate a refractive index of the conductive material layer S1, and inputting the refractive index of the conductive material layer S1 into Equation 3.

$$R = \frac{1}{2}(R_s + R_p)$$ [Equation 2]

$$R_s = \left| \frac{n\cos\theta - n_a\sqrt{1 - \left(\sin\theta\frac{n}{n_a}\right)^2}}{n\cos\theta + n_a\sqrt{1 - \left(\sin\theta\frac{n}{n_a}\right)^2}} \right|^2$$

$$R_p = \left| \frac{n\sqrt{1 - \left(\sin\theta\frac{n}{n_a}\right)^2} - n_a\cos\theta}{n\sqrt{1 - \left(\sin\theta\frac{n}{n_a}\right)^2} + n_a\cos\theta} \right|^2,$$

in Equation 2, R is a reflection ratio of the terahertz waves, n is a refractive index of the conductive material layer, $\theta$ is an incident angle of the terahertz waves, and $n_a$ is a refractive index of a medium over the sample, for example, a refractive index of air. The refractive index of the medium over the sample $n_a$ may be derived from the database 149 on the basis of medium information input from the input unit 160, and the incident angle $\theta$ of the terahertz waves may be input from the input unit 160 or may be derived from the database 149.

$$\frac{n^2 - 1}{4\pi + b(n^2 - 1)} = D_c \frac{N_A \alpha}{M} \rho_m,$$ [Equation 3]

in Equation 3, Dc is a coverage density, n is a refractive index of the conductive material layer, b is a dimensionless constant value for local electric field, $N_A$ is Avogadro's number, $\alpha$ is molar polarizability, M is a molecular weight, and $\rho_m$ is a density, wherein the dimensionless constant value for the local electric field b, the molar polarizability $\alpha$, the molecular weight M, and the density $\rho_m$ may be derived from the database 149 on the basis of material information of the conductive material layer S1 that is input from the input unit 160.

Meanwhile, the coverage density represents a coverage density of one of the grid-shaped virtual regions on the surface of the sample, and when the plurality of regions are radiated with terahertz waves, the coverage density analysis unit 143 may derive the coverage density of each of the grid-shaped virtual regions using the above-described method, and the derived coverage densities derived from the coverage density analysis unit 143 may be displayed as images with different brightness levels depending on the magnitude of the coverage density of each region (for example, a region having a smaller coverage density is displayed at a lower brightness). Accordingly, a status of the surface of the sample, for example, a defect, may be inspected with the naked eye using the image. In detail, a region having a smaller coverage density is displayed at a lower brightness, and such a region displayed at a lower brightness may be a region having an actual defect.

The thickness analysis unit 147 may be a part configured to analyze a thickness of the sample S, specifically, the conductive material layer S1. In the case of thickness analysis, reflected terahertz waves are only used. In detail, a time difference $\Delta t$ between terahertz waves reflected from an upper surface of the conducive material layer and terahertz waves reflected from an interface between the conductive material layer and a substrate or a stage provided at a lower side of the conductive material layer is derived by the data extraction unit 141, and the time difference is input into Equation 4 so that a thickness value can be derived.

$$T = \frac{1}{2}v\Delta t\cos\theta,$$ [Equation 4]

in Equation 4, T is a thickness of the sample, v is a velocity of the terahertz waves, $\Delta t$ is a time difference, and $\theta$ is an incident angle of the terahertz waves in a reflective wave measurement mode. The velocity and the incident angle of the terahertz waves may be derived from the database 149.

As described above, the database 149 stores data required for analysis of sample characteristics, specifically, the inherent maximum intensity of terahertz waves, the velocity v of the terahertz waves, the incident angle θ of the terahertz waves according to the type of the emission unit 110, the refractive index $n_a$ according to the type of medium over the sample S, reference values a and b in Equation 1 according to the type of a component forming the conductive material layer or according to a mixing ratio of materials when the conductive material layer includes a plurality of materials, and a dimensionless constant value for the local electric field b, the molar polarizability α, the molecular weight M, and the density $ρ_m$ according to the type of a material forming the conductive material layer.

Hereinafter, the present invention will be described with reference to experimental examples in detail. The experimental examples are provided only to exemplify the present invention and the present invention is not limited thereto.

Sample Preparation Example 1

A polyethylene terephthalate (PET) substrate having a size of 12.0 mm×3.5 mm×225 μm was prepared, and the substrate was treated with ultrasonic waves for 10 minutes in distilled water (DI) water and ethanol to remove contaminants on a surface of the substrate. A silver nanowire dispersion having silver nanowires (having a diameter of 20 to 30 nm and a length of 30 to 40 μm) dispersed in distilled water was manufactured. Hydroxypropyl methylcellulose (HPMC) of 2.5 mg as a binder and distilled water were added to the dispersion, and the dispersion was treated with ultrasonic waves for one hour, thereby manufacturing a paste for electrode formation having a content of silver nanowires diluted to 0.15 wt %.

The manufactured paste was coated on the PET substrate using a bar coater to form a conductive material layer, and an infrared lamp (wavelength range of 800 to 1500 nm, 500 W; Adphos L40) was driven on the conductive material layer for 10 seconds at 350 W to dry the conductive material layer. Before the paste was coated, a tape was attached to the PET substrate to implement a thickness gradient on the conductive material layer. In addition, a part of the conductive material layer was polished using sandpaper to purposely generate a defect in the conductive material layer.

Sample Preparation Example 2

A paste for electrode formation was manufactured using the same method as that described in sample preparation example 1 with respect to a total weight of 100 wt % of nanowires in the paste (except for the paste manufactured to contain silver nanowires at 75 wt % and copper nanowires at 5 wt %), and coated on the PET substrate in the same method as that described in the sample preparation example 1, thereby manufacturing a sample.

Sample Preparation Example 3

A paste for electrode formation was manufactured in the same method as that described in sample preparation example 1 except that copper nanowires were used (100 wt %) instead of silver nanowires, and the paste was coated on the PET substrate in the same method as that described in sample preparation example 1, thereby manufacturing a sample.

Measurement Example

A sample was fixed to the stage, terahertz waves having a frequency range of 0.1 THz to 3.0 THz were radiated to the sample at an incident angle of about 30°, and terahertz waves reflected from the sample were received by a receiver. By using characteristics of the received terahertz waves, characteristics of the sample were analyzed as follows.

Figure 5:
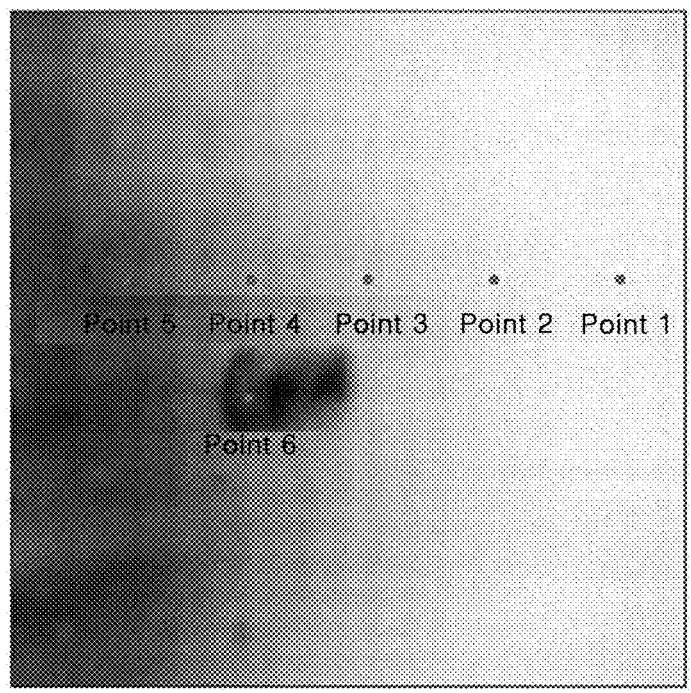
FIG. 5 is an image of a conductive material layer, obtained in sample preparation example 1, by using a terahertz wave analysis apparatus.

FIG. 5 is an image of a conductive material layer, obtained in sample preparation example 1, by using a terahertz wave analysis apparatus. In detail, terahertz waves radiated onto each grid-shaped virtual region of the conductive material layer at an incident angle of 30°, and the conductive material layer were imaged with brightness levels proportionate to their maximum intensity values of terahertz waves reflected from the each of the regions of conductive material layer.

Referring to FIG. 5, a region in which a defect was purposely formed in the first sample preparation example (point 6) is displayed at a lower brightness level when compared to other regions, and due to the thickness gradient, the brightness levels decrease from the right side toward the left side (in a direction from point 1 to point 5) which shows that the conductive material layer has a reduced thickness as from the right side toward the left side.

Figure 6:
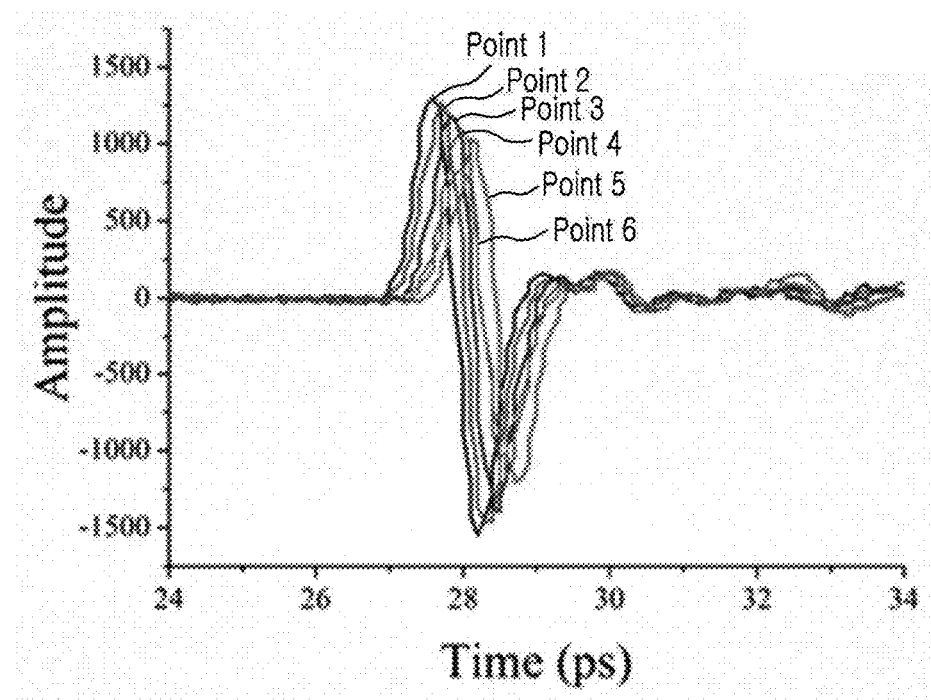
FIG. 6 is a graph showing a change in intensity of terahertz waves reflected from points shown in FIG. 5 over time.

FIG. 6 is a graph showing change in the intensities of terahertz waves reflected from points shown in FIG. 5 over time.

Referring to FIG. 6, the maximum intensity values of the terahertz waves decrease from point 1 toward point 5, and the lowest maximum intensity value is shown at point 6.

Figure 7:
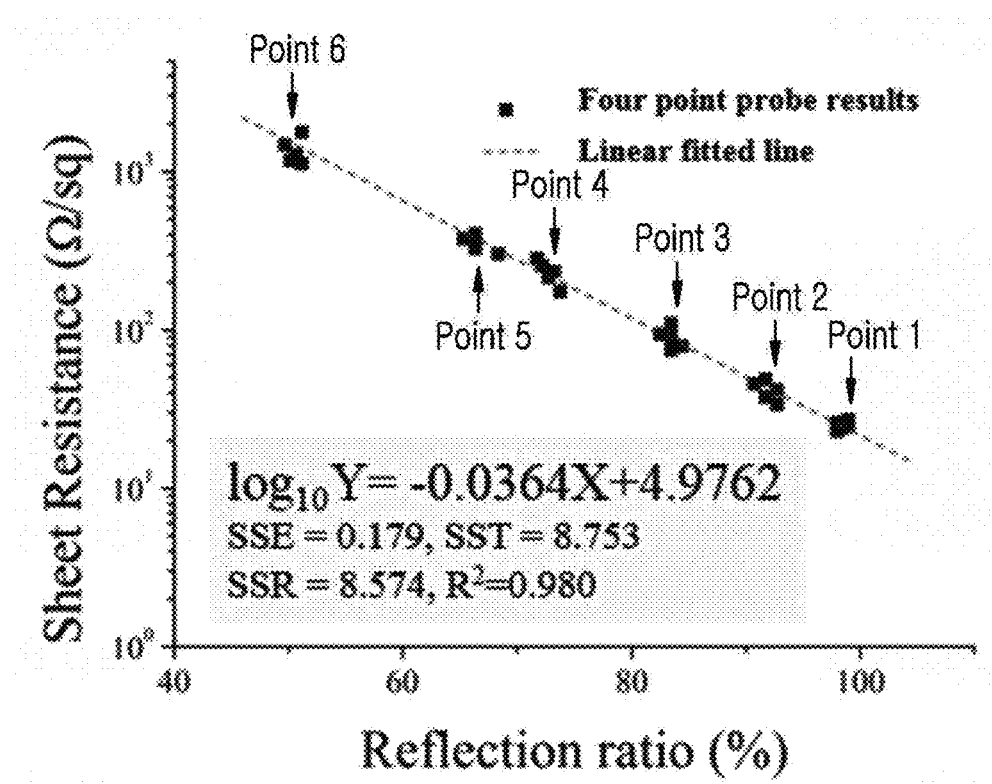
FIG. 7 is a graph showing a relationship between reflection ratios of terahertz waves reflected from a plurality of regions of a sample prepared in sample preparation example 1 and sheet resistances that are actually measured at the regions.

FIG. 7 is a graph showing a relationship between reflection ratios of terahertz waves reflected from a plurality of regions of a sample prepared in sample preparation example 1 and sheet resistances that are actually measured at the regions. The plurality of regions represent nearby regions around each point shown in FIG. 5, and the sheet resistances were measured by a four point probe method.

Referring to FIG. 7, the reflection ratio (the X-axis) and a common logarithmic value of the sheet resistance (the Y-axis) are extrapolated with a linear function having a negative gradient as shown below.

$$\log_{10} R_{sh} = -0.0364X + 4.9762 \text{ (Rsh=sheet resistance, X=reflection ratio)}$$

That is, according to Equation 1, the value a is −0.0364 and the value b is 4.9762.

Figure 8:
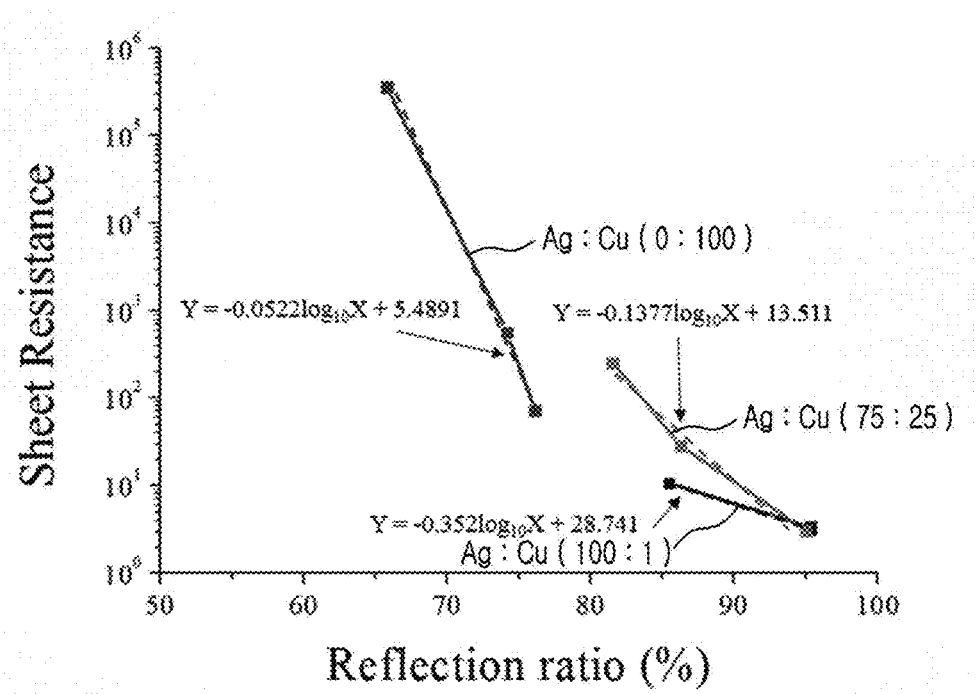
FIG. 8 is a graph showing a relationship between reflection ratios of terahertz waves reflected from a plurality of regions of each sample prepared in sample preparation examples 1 to 3 and sheet resistances that are actually measured at the regions.

FIG. 8 is a graph showing a relationship between reflection ratios of terahertz waves reflected from a plurality of regions of each sample prepared in sample preparation examples 1 to 3 and sheet resistances that are actually measured at the regions. The sheet resistances were measured using the four point probe method.

Referring to FIG. 8, the reflection ratios (the X-axis) and the common logarithmic values of the sheet resistances (the Y-axis) were extrapolated with linear functions having negative gradients as shown below, in which the negative gradients vary depending on a mixing ratio of nanowires.

In detail, for each of the samples according to sample preparation examples 1 to 3, the reflection ratio (the X-axis) and the common logarithmic value of the sheet resistance (the Y-axis) were extrapolated with each linear function shown below.

[Sample Preparation Example 3: Ag:Cu=0:100 wt %]

$$\log_{10} R_{sh} = -0.352X + 28.741$$

(Rsh=sheet resistance, X=reflection ratio, the value a is −0.352 and the value b is 28.741 in Equation 1)

[Sample Preparation Example 2: Ag:Cu=75 wt %:25 wt %]

$$\log_{10} R_{sh} = -0.1377X + 13.511$$

(Rsh=sheet resistance, X=reflection ratio, the value a is −0.1377 and the value b is 13.511 in Equation 1)

[Sample Preparation Example 1: Ag:Cu=100 wt %:0]

$$\log_{10} R_{sh} = -0.0369X + 4.9891$$

(Rsh=sheet resistance, X=reflection ratio, the value a is −0.0369 and the value b is 4.9891 in Equation 1)

The linear functions derived from each of the samples according to sample preparation examples 1 to 3 have different negative gradients and different Y-intercepts depending on the mixing ratio of nanowires. At this time, the values a and b derived from the experiments are determined as reference values, reflection ratios and sheet resistances of at least two points having different thicknesses of the sample are obtained when the mixing ratio of the sample is not identified, values a and b of Equation 1 are calculated from the reflection ratios and the sheet resistances, and the calculated values a and b are compared with the reference values a and b to derive reference values a and b that are closest to the calculated values a and b so that a mixing ratio corresponding to the derived reference values a and b is obtained. The obtained mixing ratio is a value approximating a mixing ratio of the sample whose mixing ratio is not identified.

Figure 9:
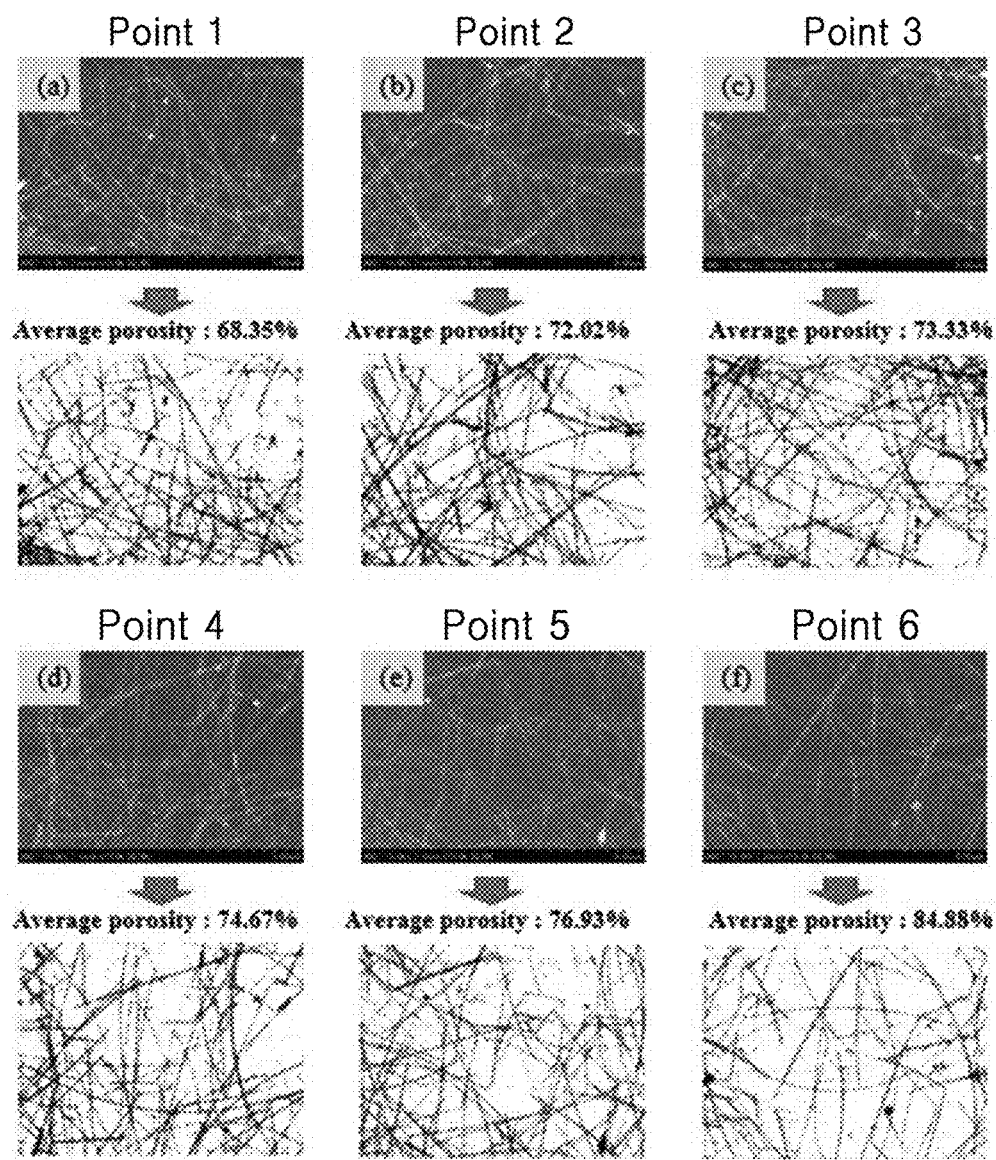
FIG. 9 is a view illustrating scanning electron microscope (SEM) images obtained by capturing each point of the sample prepared in sample preparation example 1 and actual average porosities that are calculated from the SEM images.

FIG. 9 is a view illustrating scanning electron microscope (SEM) images obtained by capturing the respective points of the sample prepared in sample preparation example 1 and actual average porosities that are calculated from the SEM images. The average porosity is a ratio of pixels not occupied by nanowires with respect to all of the pixels of an SEM image.

Referring to FIG. 9, the average porosities of points 1, 2, 3, 4, 5 and 6 are 68.35%, 72.02%, 71.33%, 75.67%, 76.93% and 84.88%, respectively. In other words, coverage densities at the points 1, 2, 3, 4, 5 and 6 are 31.65%, 27.98%, 26.67%, 24.33%, 23.07%, and 15.12%, respectively.

Figure 10:
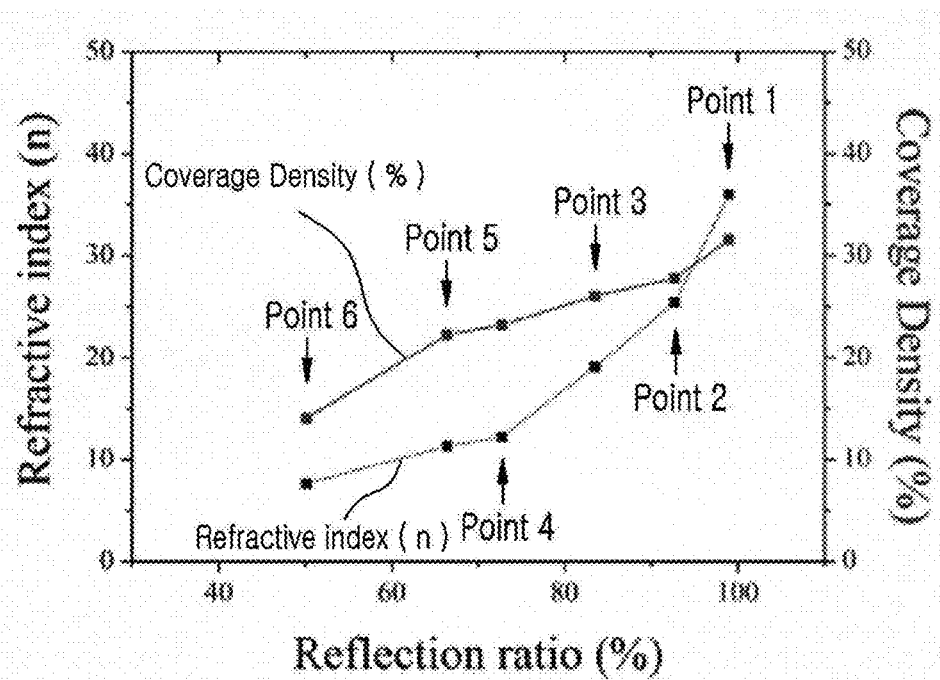
FIG. 10 is a graph showing a reflection ratio, a refractive index and a coverage density at each of the points of the sample obtained in sample preparation example 1.

FIG. 10 is a graph showing a reflection ratio, a refractive index, and a coverage density at each point of the sample obtained in sample preparation example 1. In addition, the refractive index is a value obtained by inputting the reflection ratio into Equation 2. In Equation 2, an incident angle θ of terahertz waves is 30°, and a value input as a refractive index of the medium over the sample $n_a$ is 1, that is, a refractive index of air. The coverage density is a value obtained by inputting the refractive index into Equation 3. In Equation 3, as input values with respect to a bulk of silver, a dimensionless constant value for local electric field b is 4π/3, a molar polarizability α is $6.0 \times 10^{-30}$ cm$^3$/mol, a molecular weight M is 107.8682 g/mol, and a density $\rho_m$ is 10.49 g/cm$^3$.

Referring to FIG. 10, the coverage densities at points 1, 2, 3, 4, 5 and 6 obtained by using the measured reflection ratio of terahertz waves, Equation 2, and Equation 3 are 31.54%, 27.79%, 26.05%, 23.22%, 22.30% and 14.04%, respectively, which are significantly similar to the actual coverage densities at points 1, 2, 3, 4, 5 and 6 described above with reference to FIG. 9. Therefore, the coverage densities obtained by a process of using Equation 2 and Equation 3 based on the measured reflection ratio of terahertz waves are proved as valid values.

Figure 11:
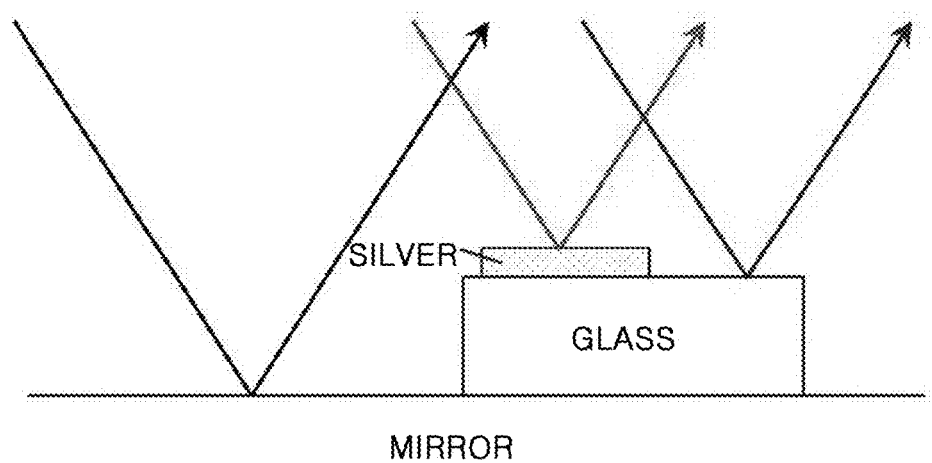
FIG. 11 is a mimetic diagram schematically illustrating a sample that is prepared for thickness measurement.
Figure 12:
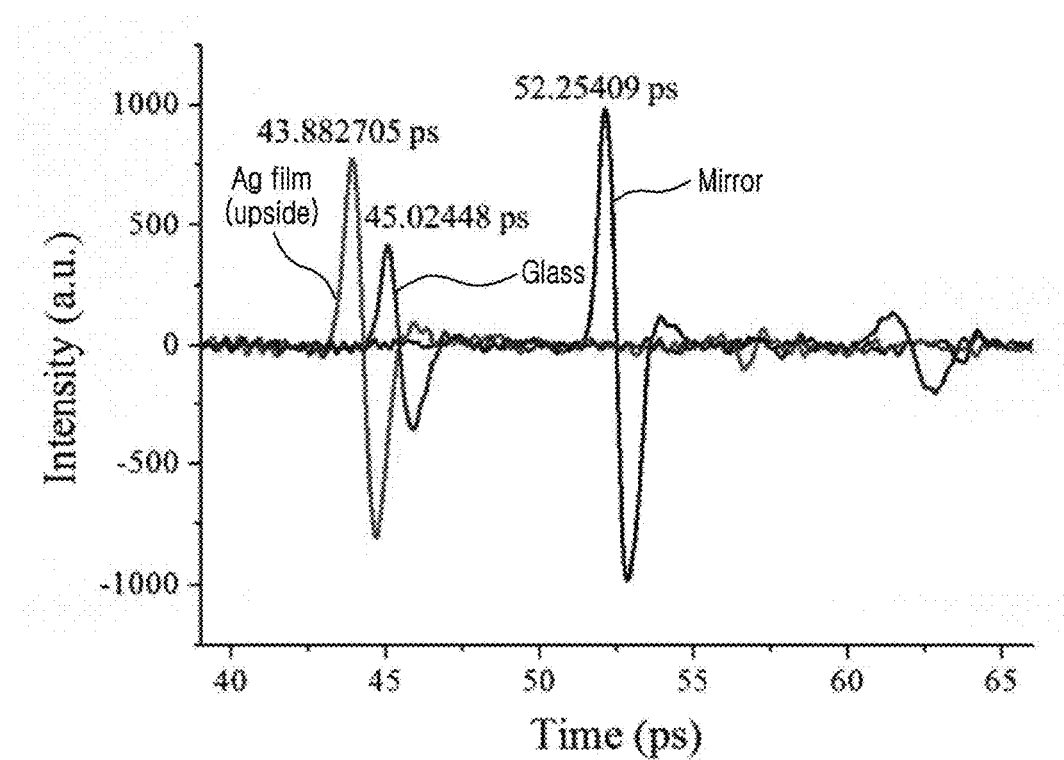
FIG. 12 is a graph showing a change in intensity of terahertz waves reflected from a sample over time.

FIG. 11 is a mimetic diagram schematically illustrating a sample that is prepared for thickness measurement, and FIG. 12 is a graph showing a change in intensity of terahertz waves reflected from a sample over time.

Referring to FIG. 11, a sample was prepared using a glass substrate having a thickness of 990 μm in the same manner as sample preparation example 1 except that a silver paste layer was coated at a thickness of about 158.2. μm without having a thickness gradient. A mirror was located on the stage of the analysis apparatus using terahertz waves, and the sample was put on the mirror. In addition, an incident angle of terahertz waves was set to 24°.

Referring to FIG. 12, the maximum intensity of terahertz waves reflected from an upper surface of the silver paste layer was detected at 43.882705 ps, and the maximum intensity of terahertz waves reflected from an interface between the silver paste layer and the glass substrate provided at a lower side of the silver paste layer was detected at 45.02448 ps, and a time difference Δt between the terahertz waves was 1.141775 ps. The time difference Δt, the terahertz wave incident angle of 24°, and the velocity of terahertz waves of $2.9979 \times 10^8$ m/s were input into Equation 4, and a thickness value of 156.35 μm was derived. That is, the measured value (156.35 μm) had an error of about 1.1% with respect to the actual value of the silver paste layer (158.2 μm).

In addition, the maximum intensity of the terahertz waves reflected from the interface between the silver paste layer and the glass substrate provided at the lower side of the silver paste was detected at 45.02448 ps, and the maximum intensity of terahertz waves reflected from an interface between the glass substrate and the mirror provided at a lower side of the glass substrate was detected at 52.25409 ps, and a time difference Δt between the terahertz waves was 7.22961 ps. The time difference Δt, the incident angle of 24° and the velocity of the terahertz waves of $2.9979 \times 10^8$ m/s were input into Equation 4, so that a thickness value of 989.993 μm was derived. That is, the measured value (989.993 μm) was almost identical to the actual value of the glass substrate (990 μm).

Therefore, the thickness values obtained by a process of using the times at which the maximum intensities of the measured terahertz waves are detected and Equation 4 are proved as valid values.

As is apparent from the above, the apparatus and method for sample analysis according to the example embodiments of the present invention can analyze various characteristics of a sample in a non-contact manner, and thus constraints occurring with the contact-type analysis can be effectively removed. In addition, a sheet resistance component, a coverage density, and a thickness of a sample can be predicted with superior reliability using terahertz waves.

While the example embodiments of the present invention and their advantages have been described in detail, it should be understood that various changes, substitutions and alterations may be made herein without departing from the scope of the invention.

What is claimed is:

1. An apparatus for non-contact sample analysis, the apparatus comprising:
   an emission unit radiating terahertz waves onto a sample provided with a conductive material layer, which is a metal nanowire layer, a metal mesh layer or transparent conductive metal oxide layer;
   a receiving unit receiving terahertz waves reflected from the sample or terahertz waves passing through the sample;
   a characteristic analysis unit including at least one selected from a group consisting of a sheet resistance analysis unit analyzing a sheet resistance of the conductive material layer, a coverage density analysis unit analyzing a coverage density of the conductive material layer, and a thickness analysis unit analyzing a thickness of the conductive material layer by using the received terahertz waves;

a display unit displaying a result derived from the characteristic analysis unit as an image; and an input unit configured to input information to the characteristic analysis unit, wherein the sheet resistance analysis unit derives the sheet resistance of the conductive material using Equation 1:

$$\log_{10} R_{sh} = aX + b, \qquad \text{[Equation 1]}$$

in Equation 1, X is a reflection ratio or a transmission ratio obtained by using the received terahertz waves, a and b are values depending on a material forming the conductive material layer, and Rsh is the sheet resistance of the conductive material layer, wherein the coverage density analysis unit derives the coverage density using Equations 2 and 3:

$$R = \frac{1}{2}(R_s + R_p) \qquad \text{[Equation 2]}$$

$$R_s = \left| \frac{n\cos\theta - n_a\sqrt{1 - \left(\sin\theta\frac{n}{n_a}\right)^2}}{n\cos\theta + n_a\sqrt{1 - \left(\sin\theta\frac{n}{n_a}\right)^2}} \right|^2$$

$$R_p = \left| \frac{n\sqrt{1 - \left(\sin\theta\frac{n}{n_a}\right)^2} - n_a\cos\theta}{n\sqrt{1 - \left(\sin\theta\frac{n}{n_a}\right)^2} + n_a\cos\theta} \right|^2,$$

in Equation 2, R is a reflection ratio obtained by using the received terahertz waves, n is a refractive index of the conductive material layer, θ is an incident angle of the terahertz waves with respect to the sample, and n is a refractive index of a medium over the sample, $$\frac{n^2 - 1}{4\pi + b(n^2 - 1)} = D_c \frac{N_A \alpha}{M} \rho_m, \qquad \text{[Equation 3]}$$

in Equation 3, Dc is the coverage density, n is the refractive index of the conductive material layer, b is a dimensionless constant value for a local electric field, $N_A$ is Avogadro's number, α is molar polarizability, M is a molecular weight and $\rho_m$ is a density, wherein the dimensionless constant value for the local electric field b, the molar polarizability α, the molecular weight M, and the density $\rho_m$ are values based on the material forming the conductive material layer, and wherein the thickness analysis unit derives the thickness of the conductive material layer using Equation 4:

$$T = \frac{1}{2} v \Delta t \cos\theta, \qquad \text{[Equation 4]}$$

in Equation 4, T is the thickness of the conductive material layer, v is a velocity of the terahertz waves, Δt is a difference between a time at which terahertz waves reflected from an upper surface of the conductive material layer and received by the thickness analysis unit has a maximum intensity and a time at which terahertz waves reflected from a lower surface of the conductive material layer and received by the thickness analysis unit has a maximum intensity, and θ is an incident angle of the terahertz waves with respect to the sample.

2. The apparatus of claim 1, wherein:
the characteristic analysis unit further includes a database;
the values a and b shown in Equation 1 are reference values stored in the database to correspond to the material forming the conductive material layer; and
the sheet resistance analysis unit is deriving the sheet resistance by:
deriving a reference value a and a reference value b of Equation 1 from the database on the basis of information about the material forming the conductive material layer that is input from the input unit; and
inputting the reflection ratio or transmission ratio obtained by using the received terahertz waves, the reference value a, and the reference value b into Equation 1.

3. The apparatus of claim 1, wherein:
the sheet resistance represents a sheet resistance of each grid-shaped virtual region on a surface of the conductive material layer; and
the display unit displays sheet resistances derived from the sheet resistance analysis unit as two dimensional images with different brightness levels depending on a magnitude of the sheet resistance of each of the regions.

4. An apparatus for non-contact sample analysis, the apparatus comprising:
an emission unit radiating terahertz waves onto a sample provided with a conductive material layer, which is a metal nanowire layer, a metal mesh layer or transparent conductive metal oxide layer;
a receiving unit receiving terahertz waves reflected from the sample or terahertz waves passing through the sample;
a characteristic analysis unit including a component analysis unit analyzing a component of the conductive material layer;
a display unit displaying a result derived from the characteristic analysis unit as an image; and
an input unit configured to input information to the characteristic analysis unit
wherein the component analysis unit derives a type or a mixing ratio of a material that forms the conductive material layer using Equation 1:

$$\log_{10} R_{sh} = aX + b, \qquad \text{[Equation 1]}$$

in Equation 1, X is a reflection ratio or a transmission ratio obtained by using the received terahertz waves, a and b are values depending on the type or the mixing ratio of the material forming the conductive material layer, and Rsh is the sheet resistance of the conductive material layer.

5. The apparatus of claim 4, wherein:
the characteristic analysis unit further includes a database that stores a reference value a and a reference value b that correspond to the type or the mixing ratio of the material forming the conductive material layer; and
the component analysis unit is deriving the type or the mixing ratio of the material forming the conductive material layer by receiving sheet resistances of two regions of the conducive material having thicknesses different from each other, receiving reflection ratios or transmission ratios obtained using terahertz waves received from the two regions, calculating a linear extrapolation function as shown in Equation 1 based on the reflection ratios or the transmission ratios and the sheet resistances of the two regions to calculate the value of a and the value of b of Equation 1, and comparing the calculated value a and the calculated value of b with the reference value a and the reference value b stored in the database.

6. The apparatus of claim 1, wherein:
the characteristic analysis unit further includes a database; and
information about the incident angle θ of the terahertz waves with respect to the sample, the refractive index $n_a$ of the medium of the upper portion of the sample, the dimensionless constant value for the local electric field b, the molar polarizability α, the molecular weight M, and the density $\rho_m$ are values stored in the database.

7. The apparatus of claim 1, wherein:
the coverage density represents a coverage density of each grid-shaped virtual region on a surface of the conductive material layer; and
the display unit displays coverage densities derived from the coverage density analysis unit as two dimensional images with different brightness levels depending on a magnitude of the coverage density for each of the regions.

8. A method for non-contact sample analysis, the method comprising:
radiating terahertz waves onto a sample provided with a conductive material layer which is a metal nanowire layer, a metal mesh layer or a transparent conductive metal oxide layer;
receiving terahertz waves reflected from the sample or terahertz waves passing through the sample; and
performing at least one analysis of an analysis of a sheet resistance of the conductive material layer, an analysis of a coverage density of the conductive material layer, an analysis of a component of the conductive material layer, and an analysis of a thickness of the conductive material layer by using the received terahertz waves.

9. The method of claim 8, wherein the analysis of a sheet resistance of the conductive material layer includes deriving the sheet resistance of the conductive material using Equation 1:

$$\log_{10} R_{sh} = aX + b, \qquad \text{[Equation 1]}$$

in Equation 1, X is a reflection ratio or a transmission ratio obtained by using the received terahertz waves, a and b are values depending on a material forming the conductive material layer, and Rsh is the sheet resistance of the conductive material layer.

10. The method of claim 9, wherein:
a and b shown in Equation 1 are reference values stored in a database; and
the analysis of a sheet resistance of the conductive material layer includes deriving the sheet resistance by:
deriving a reference value a and a reference value b of Equation 1 from the database on the basis of information about the material forming the conductive material layer, and
inputting the reflection ratio or the transmission ratio obtained by using the received terahertz waves, the reference value a, and the reference value b into Equation 1.

11. The method of claim 9, wherein:
the sheet resistance represents a sheet resistance of each grid-shaped virtual region on a surface of the conductive material layer; and
the method further comprises displaying sheet resistances derived from the analysis of the sheet resistance of the conductive material layer as two dimensional images with different brightness levels depending on a magnitude of the sheet resistance of each of the regions.

12. The method of claim 8, wherein the analysis of a component of the conductive material layer includes analyzing a type or a mixing ratio of a material that forms the conducive material layer using Equation 1:

$$\log_{10} R_{sh} = aX + b, \qquad \text{[Equation 1]}$$

in Equation 1, X is a reflection ratio or a transmission ratio obtained by using the received terahertz waves, a and b are values depending on the type or the mixing ratio of the material forming the conductive material layer, and Rsh is the sheet resistance of the conductive material layer.

13. The method of claim 12, wherein the analysis of a component of the conductive material layer includes deriving the type or the mixing ratio of the material forming the conductive material layer by obtaining sheet resistances of two regions of the conducive material having thicknesses different from each other, obtaining reflection ratios or transmission ratios using terahertz waves received from the two regions, calculating a linear extrapolation function as shown in Equation 1 based on the reflection ratios or the transmission ratios and the sheet resistances of the two regions to calculate a value a and a value b of Equation 1, and comparing the calculated value a and the calculated value b with a reference value of a and a reference value of b stored in a database.

14. The method of claim 13, wherein the sheet resistances of the two regions of the conductive material layer having thicknesses different from each other are obtained by a probe method.

15. The method of claim 8, wherein the analysis of a coverage density of the conductive material layer includes deriving a coverage density using Equations 2 and 3:

$$R = \frac{1}{2}(R_s + R_p) \qquad \text{[Equation 2]}$$

$$R_s = \left| \frac{n\cos\theta - n_a\sqrt{1 - \left(\sin\theta\frac{n}{n_a}\right)^2}}{n\cos\theta + n_a\sqrt{1 - \left(\sin\theta\frac{n}{n_a}\right)^2}} \right|^2$$

$$R_p = \left| \frac{n\sqrt{1 - \left(\sin\theta\frac{n}{n_a}\right)^2} - n_a\cos\theta}{n\sqrt{1 - \left(\sin\theta\frac{n}{n_a}\right)^2} + n_a\cos\theta} \right|^2,$$

in Equation 2, R is a reflection ratio obtained by using the received terahertz waves, n is a refractive index of the conducive material layer, e is an incident angle of the terahertz waves with respect to the sample, and $n_a$ is a refractive index of a medium over the sample, $$\frac{n^2 - 1}{4\pi + b(n^2 - 1)} = D_c \frac{N_A \alpha}{M} \rho_m, \qquad \text{[Equation 3]}$$

in Equation 3, Dc is a coverage density, n is the refractive index of the conductive material layer, b is a dimensionless constant value for a local electric field, $N_A$ is Avogadro's number, $\alpha$ is molar polarizability, M is a molecular weight, and $\rho_m$ is a density, wherein the dimensionless constant value for the local electric field b, the molar polarizability $\alpha$, the molecular weight M, and the density $\rho_m$ are values based on a material forming the conductive material layer.

16. The method of claim 15, wherein:
the coverage density represents a coverage density of each grid-shaped virtual region on a surface of the conductive material layer; and
the display unit displays the derived coverage densities as two dimensional images with different brightness levels depending on a magnitude of the coverage density of each of the regions.

17. The method of claim 8, wherein the analysis of a thickness of the conductive material layer includes deriving the thickness of the conductive material layer using Equation 4:

$$T = \frac{1}{2} v \Delta t \cos\theta, \qquad \text{[Equation 4]}$$

in Equation 4, T is the thickness of the conductive material layer, v is a velocity of the terahertz waves, $\Delta t$ is a difference between a time at which terahertz waves reflected from an upper surface of the conductive material layer has a maximum intensity and a time at which terahertz waves reflected from a lower surface of the conductive material layer has a maximum intensity, and $\theta$ is an incident angle of the terahertz waves with respect to the sample.

* * * * *